(12) United States Patent
Sabbatino et al.

(10) Patent No.: US 7,203,219 B2
(45) Date of Patent: Apr. 10, 2007

(54) TRANSMITTER OPTICAL SUB ASSEMBLY, FOR INSTANCE FOR HIGH SPEED OPTICAL TRANSCEIVERS

(75) Inventors: Salvatore Sabbatino, Turin (IT); Giammarco Rossi, Turin (IT); Silvio Lupo, Turin (IT); Enrico Di Mascio, Turin (IT)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 51 days.

(21) Appl. No.: 10/804,696

(22) Filed: Mar. 19, 2004

(65) Prior Publication Data

US 2004/0184742 A1 Sep. 23, 2004

(30) Foreign Application Priority Data

Mar. 19, 2003 (EP) .................................. 03251711

(51) Int. Cl.
*H01S 3/00* (2006.01)
(52) U.S. Cl. ......................................... 372/109; 385/92
(58) Field of Classification Search ................ 372/109, 372/108, 101; 257/50, 82; 385/14, 92
See application file for complete search history.

(56) References Cited

U.S. PATENT DOCUMENTS

| 5,422,900 | A | | 6/1995 | Reele et al. .................... 372/29 |
| 5,724,187 | A | * | 3/1998 | Varaprasad et al. .......... 359/608 |
| 6,172,337 | B1 | * | 1/2001 | Johnsgard et al. ............ 219/390 |
| 6,243,508 | B1 | * | 6/2001 | Jewell et al. .................. 385/14 |
| 6,583,445 | B1 | * | 6/2003 | Reedy et al. .................. 257/82 |

FOREIGN PATENT DOCUMENTS

| EP | 0 987 802 | 3/2000 |
| JP | 2001156381 | 6/2001 |

OTHER PUBLICATIONS

Patent Abstracts of Japan, European Patent Office, JP 2001156381, Jun. 8, 2001, Kyocera Corp.
Patent Abstracts of Japan, European Patent Office, JP 08330776, Dec. 13, 1996, Discovision Assoc.
Nineo et al., "Optical Transmitter Module for 10Gbit/s Optical Communication Systems", OKI Technical Review, OKI electric Industry, Tokyo, Japan, vol. 63, No. 158, 1997, pp. 55-58.
Delorme et al,., "12 Wavelength Channel Fast Switching Operation of Compact DBR Laser Modules Including IC-drivers", Electronics Letters, IEE Stevenage, GB, vol. 32, No. 18, 1996, pp. 1670-1671.

* cited by examiner

*Primary Examiner*—Tuyet Vo
*Assistant Examiner*—Jimmy Vu

(57) ABSTRACT

A transmitter optical sub assembly includes a laser source having associated therewith a laser driver and a package for housing the laser source (10) and the laser driver. The package includes respective separate compartments for the laser source and the laser driver, wherein a package wall, which is opaque to IR emission, separates the laser source from the laser driver. The laser source and the laser driver are arranged in those separate compartments whereby the laser source is exempt from being directly irradiated by the laser driver.

17 Claims, 2 Drawing Sheets

PRIOR ART

TRANSMITTER OPTICAL SUB ASSEMBLY, FOR INSTANCE FOR HIGH SPEED OPTICAL TRANSCEIVERS

BACKGROUND OF THE INVENTION

1. Field of the Invention

The present invention is directed to a transmitter optical sub-assembly, in particular, a transmitter optical sub-assembly including a laser source having an associated laser driver.

2. Brief Description of Related Developments

Transmission speed is an ever-increasing parameter in data communication systems. Achieving and ensuring the required performance levels of such systems with conventional methods of packaging optoelectronic components are increasingly difficult at transmission speeds of 10 Gbit/s and higher.

This is particularly true for optical communication transceivers for use in systems where large volumes of data are aggregated to form serial data streams with very high rates. These data streams are subsequently used to drive light sources such as laser sources. As the transmission speed/rate increases, apparatus such as optical transmitters intended to have small dimensions and required to be produced at low cost is exposed to significant issues in terms of thermal management and signal integrity.

At transmission rates of 10 Gbit/s and higher, the existing solutions for producing a transmitter optical sub assembly (TOSA) are particularly exposed to critical operating conditions. This applies to both basic types of TOSA. arrangements currently adopted.

A first type of known TOSA arrangement is shown in FIGS. 1 and 2. These figures refer to TOSA packages of the types currently referred to as TO-CAN and planar, respectively. Either type of arrangement includes a laser diode driver LDD and a laser diode LD assembled in the same package PKG that is traversed by electrical lines L. These types of arrangement are advantageous in that the connections between the laser driver LDD and the laser diode LD may be minimized.

The main drawback of this arrangement lies in that heat dissipated by the driver is transferred to the laser diode by conduction, convection and IR emission within the common package. Laser diode performance degrades with increasing temperature, and careful thermal management is needed in order to guarantee the desired performance. Thermal management is usually effected by cooling the laser by means of Peltier devices, which however add to the overall power consumption while also leading to additional costs and dimensions of the module.

Alternatively, laser diodes may be employed that are adapted to operate at higher temperatures, but this has a negative impact in terms of yield and overall costs of the transmitter. Extensive use of thermally conductive materials, which may also help in the circumstances outlined in the foregoing, inevitably entails higher costs.

Another type of known TOSA arrangement is exemplified in FIG. 3. There, the laser source LD is located on an optical bench OB and packaged alone within the package PKG. The laser driver is placed on a printed circuit board PCB, outside the package.

This latter solution is advantageous in terms of thermal management. Designing the electrical connections between the laser diode and the driver is however more complicated and less effective. Impedance mismatch between the laser driver and the laser diode creates electrical reflections that lead to impairment of electrical performance, particularly at high bit rates.

This problem could be avoided by adding in series with the laser diode a resistor to match the driver impedance. However, in such an arrangement, a part of the signal power is lost due to the voltage drop across the matching resistor. Also, the laser driver output swing is limited and related to the supply voltage; this solution can thus be resorted to only by using a higher supply voltage (5 V or more). This choice leads to higher power dissipation and adds to the system complexity, since all the other circuits in a transceiver are usually fed from a 3.3 V power supply.

SUMMARY OF THE INVENTION

The object of the present invention is thus to provide an improved arrangement wherein the drawbacks referred to in the foregoing are dispended with. According to the present invention, such an object is achieved by means of an arrangement having the features set forth in the claims that follow.

A preferred embodiment of the invention is thus a transmitter optical sub assembly including a laser source having associated therewith a laser driver and a package for the laser source and the laser driver. The package includes respective separate compartments for the laser source and the laser driver. The laser source and the laser driver are arranged in the respective separate compartments whereby the laser source is exempt from being directly irradiated by the laser driver.

This is preferably due to the package wall, which is opaque to IR emission, thus separating the two devices.

Preferably, a package with two compartments is used: the first compartment, surrounded by walls and hermetically sealed, hosts the laser diode with the alignment optics; the second compartment is simply a base member to place the laser driver and other auxiliary components.

A preferred thermal path guarantees thermal dissipation from the laser driver. A good electrical path is preferably guaranteed by the fact that the electrical path is laid out onto a substrate such an alumina substrate.

The arrangement described hereafter provides a good solution in terms of both thermal dissipation and signal integrity without requiring a matching resistor.

BRIEF DESCRIPTION OF THE DRAWINGS

The invention will now be described, by way of example only, with reference to the enclosed figures of drawing, wherein.

DETAILED DESCRIPTION OF THE PREFERRED EMBODIMENT(S)

Figure 1:
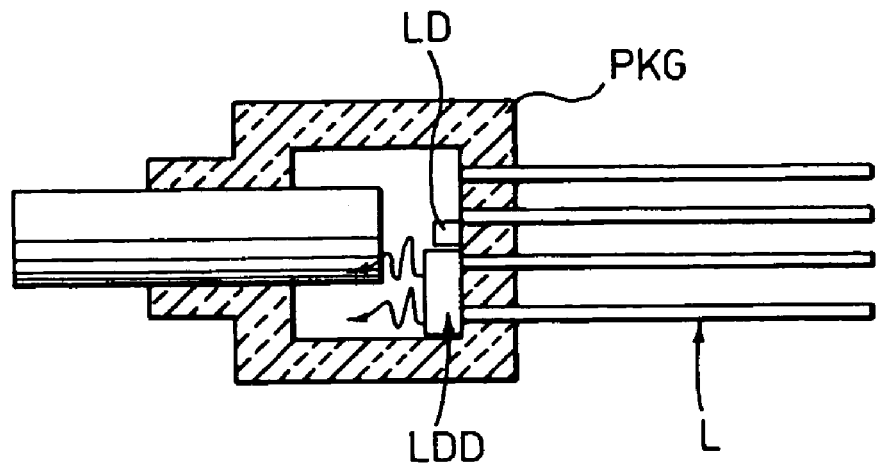
FIGS. 1 to 3, representative of the prior art, have been already described in the foregoing.
Figure 2:
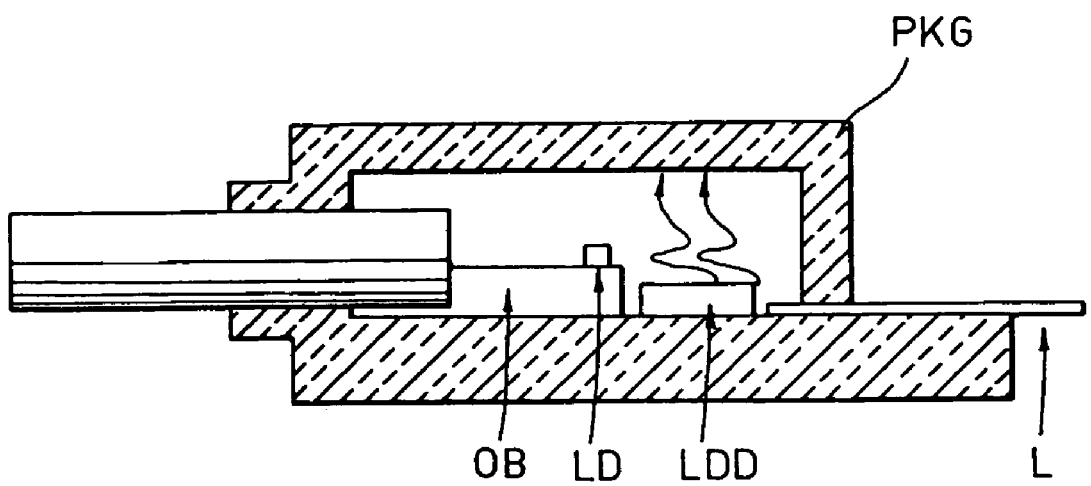
Figure 3:
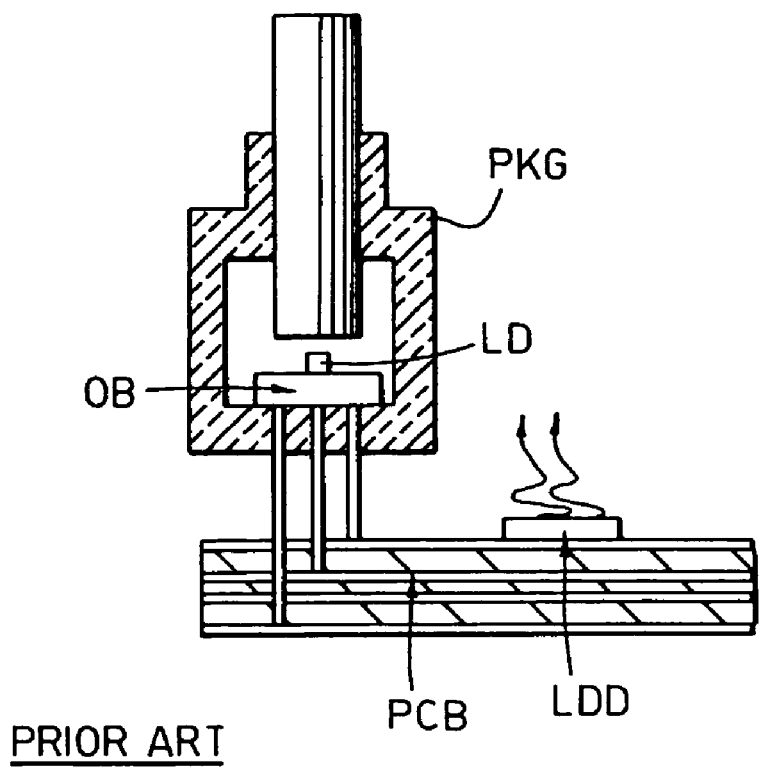
Figure 4:
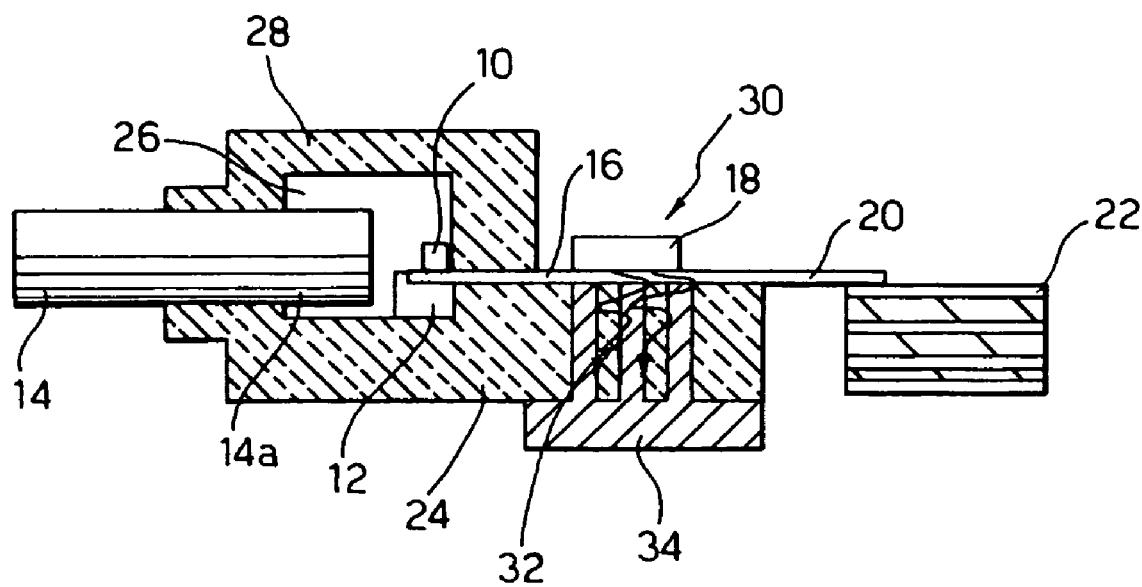
FIG. 4 is a schematic representation of an arrangement according to the invention.

In FIG. 4, a transmitter optical sub assembly (briefly TOSA) is shown. This includes a laser source such as a laser diode 10 mounted on an optical bench 12 and arranged for launching optical radiation into an optical fiber 14. One or more feed-through lines 16 connect the laser source 10 to an associated laser driver 18. Additional lines 20 connect the laser driver 18 to corresponding circuitry mounted on a printed circuit board 22.

The arrangement of parts and components just described is—per se—conventional in the art, which makes it unnecessary to provide a more detailed description herein.

The laser diode 10 is housed in a package 24. This is essentially comprised of a shaped body of a material opaque to infrared radiation such as a ceramics (e.g. alumina), possibly including a charge.

The package 24 is a two-compartment package.

A first compartment, generally indicated 26, is surrounded by walls and hermetically sealed by a lid 28. The compartment 26 hosts the laser diode 10 with the alignment optics 14a (of a known type) with the fiber 14. The end portion of the fiber 14 and the feed through lines 16 from the laser driver 18 extend through the walls of the compartment 26.

As shown in FIG. 4, the second compartment designated 30 may simply be a base member extending from the body of the package and adapted to place the laser driver 16 and other auxiliary components.

The second compartment 30 of the package may include a recess (not shown) for at least partly housing the laser driver 16. Such a recessed mounting is suitable for possibly reducing wire-bonding lengths towards the laser driver 16.

Reference 32 denotes a thermal path, usually comprised of one or more metalizations extending through the package 24 towards a plate 34. The plate 34 is generally exposed to the outside surface of the package 24 and/or may include a ribbed configuration to guarantee good thermal dissipation from the laser driver.

As a consequence of the laser source 10 and the laser driver 18 being arranged in two separate compartments of the package 24, the laser diode 10 not being directly irradiated by the laser driver. This is primarily is due to the package wall located there between, which is opaque to IR emission, thus separating the two devices.

Electrical paths such as the feed through lines 16 are preferably laid out onto a substrate such an alumina substrate. This facilitates control of RF performance while avoiding any unwanted parasitic element, while also permitting feed through circuits to be designed that correct carries the signal up to 10 GHz and more.

Moreover, the absence of boundary walls in the second compartment 30 leaves additional space available for additional components, while also permitting the dimensions of the package to be reduced beyond what is currently admitted by conventional single compartment solutions.

By way of summary, the arrangement just described offers a unique benefit to fiber optic transceivers while ensuring good high frequency signal transmission and blocking the heat irradiated to the laser source from the laser driver. Additionally a hermetic package solution for the laser diode is offered while also giving the possibility of further reducing the overall dimension of the package.

Of course, without prejudice to the underlying principle of the invention, the details and embodiments may vary, also significantly, with respect to what has been shown and described, just by way of example, without departing from the scope of the invention as defined by the annexed claims.

What is claimed is:

1. A transmitter optical sub assembly including a laser source having associated therewith a laser driver as well as a package for said laser source and said laser driver, wherein said package includes respective separate compartments for said laser source and said laser driver, the laser source and the laser driver being arranged in said separate compartments whereby said laser source is exempt from being directly irradiated by said laser driver, and wherein said package includes a package wall opaque to IR emission separating said laser source and said laser driver.

2. The assembly of claim 1, wherein said package is essentially comprised of a shaped body of an IR opaque material.

3. The assembly of claim 1, wherein said package is essentially comprised of a shaped body of a ceramics material.

4. The assembly of claim 1, wherein said package is essentially comprised of a shaped body of alumina.

5. The assembly of claim 1, wherein the compartment provided in said package for said laser source is surrounded by walls.

6. The assembly of claim 5, further comprising feed through lines connecting said laser source to said laser driver, wherein said feed through lines extend through the walls of said compartment provided in said package for said laser source.

7. The assembly of claim 1, further comprising feed through lines connecting said laser source to said laser driver, wherein said lines are laid out onto a substrate such an alumina substrate.

8. The assembly of claim 1, wherein said package includes a compartment for hosting said laser source together with alignment optics associated therewith.

9. The assembly of claim 1, wherein the compartment provided in said package for said laser driver is defined by a base member extending from the body of the package.

10. The assembly of claim 1, wherein the compartment provided in said package for said laser driver is defined by a base member exempt from boundary walls.

11. The assembly of claim 1, wherein the compartment provided in said package for said laser driver includes a recess for at least partly housing the laser driver.

12. The assembly of claim 1, wherein the compartment provided in said package for said laser driver has associated a thermal path extending through the package.

13. The assembly of claim 12, wherein said thermal path includes at least one metalization extending through the package.

14. The assembly of claim 12, wherein said thermal path extends towards a plate.

15. The assembly of claim 14, wherein said plate is generally exposed to the outside surface of the package.

16. The assembly of claim 14, wherein said plate includes a ribbed configuration to guarantee thermal dissipation.

17. A transmitter optical sub assembly including a laser source having associated therewith a laser driver as well as a package for said laser source and said laser driver, wherein said package includes respective separate compartments for said laser source and said laser driver, and said package includes a package wall opague to IR emission separating said laser source and said laser driver, the laser source and the laser driver being arranged in said separate compartments whereby said laser source is exempt from being directly irradiated by said laser driver, and said compartment provided in said package for said laser driver is defined by a base member exempt from boundary walls.

* * * * *

UNITED STATES PATENT AND TRADEMARK OFFICE
CERTIFICATE OF CORRECTION

PATENT NO. : 7,203,219 B2
APPLICATION NO. : 10/804696
DATED : April 10, 2007
INVENTOR(S) : Salvatore Sabbatino Page 1 of 1

It is certified that error appears in the above-identified patent and that said Letters Patent is hereby corrected as shown below:

Col. 2 Line 8 Delete "al,.," and insert -- al., --, therefor.

Col. 4 Line 55 In Claim 17, delete "opague" and insert -- opaque --, therefor.

Signed and Sealed this

Second Day of December, 2008

JON W. DUDAS
*Director of the United States Patent and Trademark Office*